US007357291B2

(12) United States Patent
Shoji et al.

(10) Patent No.: US 7,357,291 B2
(45) Date of Patent: Apr. 15, 2008

(54) SOLDER METAL, SOLDERING FLUX AND SOLDER PASTE

(75) Inventors: Takashi Shoji, Chiba (JP); Ayako Nishioka, Chiba (JP); Tadatoshi Kurozumi, Chiba (JP); Yoshinori Shibuya, Chiba (JP); Hitoshi Amita, Chiba (JP)

(73) Assignee: Showa Denko K.K., Tokyo (JP)

( * ) Notice: Subject to any disclaimer, the term of this patent is extended or adjusted under 35 U.S.C. 154(b) by 79 days.

(21) Appl. No.: 10/492,166

(22) PCT Filed: Jan. 30, 2003

(86) PCT No.: PCT/JP03/00873

§ 371 (c)(1),
(2), (4) Date: Nov. 18, 2005

(87) PCT Pub. No.: WO03/064102

PCT Pub. Date: Aug. 7, 2003

(65) Prior Publication Data

US 2006/0071051 A1    Apr. 6, 2006

Related U.S. Application Data

(60) Provisional application No. 60/354,021, filed on Feb. 5, 2002.

(30) Foreign Application Priority Data

Jan. 30, 2002  (JP) .............................. 2002-020925

(51) Int. Cl.
B23K 35/363 (2006.01)

(52) U.S. Cl. ........................ 228/56.3; 228/245; 148/22; 148/24

(58) Field of Classification Search ............... 228/56.3, 228/245, 246; 148/22, 23, 24, 25
See application file for complete search history.

(56) References Cited

U.S. PATENT DOCUMENTS

| | | | |
|---|---|---|---|
| 2,875,514 A * | 3/1959 | Doerr ........................ 228/199 |
| 4,533,404 A * | 8/1985 | Hasegawa .................... 148/23 |
| 4,670,217 A * | 6/1987 | Henson et al. .............. 420/562 |
| 4,684,054 A | 8/1987 | Iwasa et al. |
| 4,906,307 A * | 3/1990 | Fujiyoshi ..................... 148/26 |
| 5,234,508 A | 8/1993 | Kobayashi et al. |
| 5,538,686 A | 7/1996 | Chen et al. |
| 5,718,868 A | 2/1998 | Junichi et al. |
| 5,904,782 A | 5/1999 | Diep-Quang |
| 5,918,796 A | 7/1999 | Matsuda et al. |
| 5,938,856 A * | 8/1999 | Sachdev et al. ............. 134/1.3 |
| 6,184,475 B1 | 2/2001 | Kitajima et al. |
| 6,241,942 B1 * | 6/2001 | Murata et al. .............. 420/561 |
| 6,334,905 B1 | 1/2002 | Hanawa et al. |
| 6,476,487 B2 | 11/2002 | Kuramoto et al. |
| 6,881,278 B2 * | 4/2005 | Amita et al. ................. 148/23 |
| 6,896,172 B2 * | 5/2005 | Taguchi et al. .......... 228/180.1 |
| 2001/0025874 A1 * | 10/2001 | Nishiyama ............. 228/180.22 |
| 2001/0042779 A1 | 11/2001 | Amita et al. |
| 2002/0046627 A1 * | 4/2002 | Amita et al. .................. 75/252 |
| 2002/0102432 A1 * | 8/2002 | Ochiai et al. ............... 428/671 |
| 2003/0015574 A1 * | 1/2003 | Teshima et al. ............ 228/246 |
| 2003/0059642 A1 * | 3/2003 | Mei ........................... 428/570 |
| 2003/0143419 A1 * | 7/2003 | Nakamura .................. 428/646 |

FOREIGN PATENT DOCUMENTS

| | | |
|---|---|---|
| CN | 1286655 A | 3/2001 |
| DE | 101 14 191 A | 10/2001 |
| EP | 1 099 507 A | 5/2001 |
| JP | 3-106594 A | 5/1991 |
| JP | 03 155493 A | 7/1991 |
| JP | 4-59079 A | 9/1992 |
| JP | 06 226488 A | 8/1994 |
| JP | 7-7244 A | 1/1995 |
| JP | 2002-361476 A | 12/2002 |
| JP | 8-155676 A | 6/2005 |
| JP | 56-32079 B2 | 7/2005 |
| SU | 500948 A * | 11/1976 |

OTHER PUBLICATIONS

Patent Abstract of Japan vol. 018, No. 598 (M-1704), Nov. 15, 1994, abstracting JP 06-226488A.
Patent Abstract of Japan vol. 015, No. 381 (M-1162), Sep. 26, 1991, abstracting JP 03-155493A.
Patent Abstract of Japan vol. 2003, No. 04, Apr. 2, 2003, abstracting JP 2002-361476A.
Power Industry Handbook: 1.1.4.7 Electrical Detection Method (Coulter Counter Method).
German, "Powder Metallurgy Science," translated by Hideshi Miura and Ken-ichi Takagi, published by Uchida Rokakaho Publishing Co., Ltd., pp. 102-110 (1996).
"The ECOnomics of Environmental Compliance", by SMT (Special Series) (Surface Mount Technology Magazine) (NEPCON West '97 Buyers'Guide), published on Feb. 1997, pp. 66 and 68.
"Standard Microsoldering Technique," pp. 67-68, edited by Microsoldering Technique Qualification/Test Committe, The Japan Welding Engineering Society, published by The Nikkan Kogyo Shimbun, Ltd.

* cited by examiner

Primary Examiner—Kevin P. Kerns
(74) Attorney, Agent, or Firm—Sughrue Mion, PLLC

(57) ABSTRACT

Solder metal consists essentially of 8.8 to 5.0 mass % of Zn, 0.05 to 0 mass % of Bi and the balance of Sn and unavoidable impurities.

11 Claims, No Drawings

SOLDER METAL, SOLDERING FLUX AND SOLDER PASTE

CROSS REFERENCE TO RELATED APPLICATION

This application is an application filed under 35 U.S.C. §111(a) claiming the benefit pursuant to 35 U.S.C. §119(e)(1) of the filing date of Provisional Application No. 60/354,021 filed Feb. 5, 2002 pursuant to 35 U.S.C. §111(b).

TECHNICAL FIELD

The present invention relates to solder metal, soldering flux, solder paste and similar materials for use in mounting electronic parts on a substrate.

BACKGROUND ART

In the electronics industry, solder metal, soldering flux, solder paste and similar materials are used for mounting electronic parts on the surface of a substrate. Since solder paste is excellent in printing property and has good viscosity, it is suitable for automatic mounting and has recently been used in an increasing amount.

By screen-printing or with a dispenser, a solder paste is applied to a substrate, on which electronic parts are then mounted and to which the electronic parts are fixed through reflowing of the solder paste. The term "reflowing" used herein refers to a sequential process including the steps of preheating the substrate on which electronic parts have been placed and heating the substrate at a temperature higher than the melting temperature of the solder paste, thereby joining the parts to the substrate.

Recently, in order to keep pace with the trend for scaling down the size of electronic products, demand has arisen for electronic parts with fine pitches, and fine-pitch electronic parts, such as 0.3-mm-pitch quad flat package (QFP) type LSIs and chip size packages (CSPs), have currently been widely employed. Under these circumstances, solder paste is required to have high wettability for joining fine-pitch electronic parts so as to impart high thermal shock resistance to the joined products and to attain proper mounting of electronic parts on a substrate. In order to meet this demand in the industry, solder metal and solder paste must satisfy the above requirements.

However, when conventional solder alloy or solder paste is used for soldering fine-pitch or large-scaled electronic parts recently demanded, wettability and thermal shock resistance are unsatisfactorily attained, thus deteriorating reliability of joining portions. In addition, because of recent environmental concerns in relation to lead, use of Pb-free solder is being encouraged and accordingly development of Pb-free solder is under way.

Sn—Ag based, Sn—Cu based, Sn—Bi based and Sn—Zn based solder members have attracted attention as promising ones, because these Pb-free solder members are advantageous in terms of melting temperature, wettability and reliability in joining. However, the solder members have drawbacks. Sn—Bi based solder members are fragile though they are advantageous in terms of melting temperature. Therefore, Sn—Bi based solder has not been used in practice. Since Sn—Cu based and Sn—Ag based solder members have excessively high melting temperatures, they when used raise a problem that electronic parts to be soldered are affected during soldering. Sn—Ag based solder members cost more than conventionally used Sn—Pb solder because they contain expensive Ag. In addition, excessive use of Ag results in depletion of resources and, when released to the environment, might affect the ecological system in view of life cycle assessment (LCA).

Sn—Zn based solder has attracted attention as promising Pb-free solder, because the solder has a melting temperature most similar to that of conventional Sn—Pb eutectic alloy. To Sn—Zn based solder, Bi is added in order to further lower the melting temperature thereof and improve wettability. However, a recent study has revealed that addition of Bi to Sn—Zn based solder lowers thermal shock resistance of joined products obtained by use of the solder. Wettability of Sn-9Zn eutectic alloy can be improved by, for example, employment of flux. However, the problem of the chip-standing phenomenon arises upon mounting of electronic parts.

Conventional Sn—Pb based solder members have high stability, by virtue of a considerably small difference in oxidation potential between Sn and Pb. In contrast, in the aforementioned Pb-free solder members, Sn exhibits a considerable difference in oxidation potential from Ag, Cu or Zn, thereby promoting oxidation of solder metal, resulting in a decrease in solderability. In particular, soldering by use of Sn—Zn based solder in the air has been difficult, since Zn has an oxidation potential lower than that of Pb, resulting in severe oxidation. In order to perform soldering in the air, a large amount of strong active agent must be incorporated into flux. In this case, solder metal readily reacts with the flux, and this reaction deteriorate the stability of the solder paste employed in the soldering.

In view of the foregoing, one object of the present invention is to provide solder metal and solder paste exhibiting improved wettability and attaining high thermal shock resistance of joined portions when soldering fine-pitch or large-scaled electronic parts onto a substrate.

Another object of the invention is to provide Sn—Zn—Bi solder metal and solder paste capable of suppressing a decrease in thermal shock resistance of portions to be joined.

Still another object of the invention is to provide soldering flux that can suppress reaction with solder metal to obtain highly stable solder paste.

DISCLOSURE OF THE INVENTION

The present inventor provides solder metal consisting essentially of 8.8 to 5.0 mass % of Zn, 0.05 to 0 mass % of Bi and the balance of Sn and unavoidable impurities.

The invention further provides solder metal consisting essentially of 9.0 to 5.0 mass % of Zn, 2.0 to 0.05 mass % of Bi and the balance of Sn and unavoidable impurities.

The invention further provides solder metal consisting essentially of 8.5 to 6.5 mass % of Zn, 1.5 to 0.1 mass % of Bi and the balance of Sn and unavoidable impurities.

The invention further provides solder metal consisting essentially of 8.3 to 7.5 mass % of Zn, 1.2 to 0.5 mass % of Bi and the balance of Sn and unavoidable impurities.

Each solder metal comprises solder powder containing solder particles having a particle size of 20 μm or less in an amount controlled to 30% or less as determined in a number-basis particle-size distribution profile.

The present invention also provides soldering flux comprising a hydrocarbon compound having at least one primary, secondary or tertiary CH bond and a halogen-containing and hydrogen-donating compound.

The halogen-containing and hydrogen-donating compound can be an organic halogenated compound.

The hydrocarbon compound having at least one primary, secondary or tertiary CH bond can be one species selected from the group consisting of tetralin, tetraisobutylene, octahydroanthracene, 1-α-naphthyl-1-n-butyl-hexadecene, 9,10-dihydro-9,10-diisobutylanthracene, n-octadecylbenzene, β-n-octadecyltetralin and polyisobutylene.

The halogen-containing and hydrogen-donating compound is contained in an amount falling within a range of 0.02 to 20 mass % in terms of chlorine based on a total amount of the soldering flux.

The hydrocarbon compound having at least one primary, secondary or tertiary CH bond is contained in an amount falling within a range of 0.01 to 20 mass %, based on a total amount of the soldering flux.

The present invention also provides solder paste comprising the solder metal and the soldering flux.

The solder metal is contained in an amount falling within a range of 86 to 92 mass % and the soldering flux is contained in an amount falling within a range of 14 to 8 mass %, respectively, based on a total amount of the solder paste.

The present invention also provides a method for producing a printed circuit board, comprising the steps of applying the solder paste onto a circuit board, placing electronic parts on portions to which the solder paste has been applied and heating the circuit board so as to mount the electronic parts on the circuit board.

The invention also provides liquid flux for use in flow soldering comprising the soldering flux that is diluted with a solvent.

The invention also provides rosin-containing solder thread comprising the solder metal and the soldering flux.

In the solder metal or solder paste according to the present invention, by reducing the Zn content to approximately 7% as described above, it is possible to prevent oxidation of Sn—Zn solder metal and, by using specific flux in combination with the Sn—Zn solder metal, it is possible to improve wettablity of the solder metal to a great extent and enhance the property of mounting electronic parts on a circuit board and the thermal shock resistance of the mounted portions.

In the Sn—Zn—Bi based solder metal, by setting the Bi content at approximately 1%, it is possible to improve the thermal shock resistance of the mounted portions to a great extent and, by using as an active agent a combination of a hydrocarbon compound having at least one primary, secondary or tertiary CH bond and a halogen-containing and hydrogen-donating compound, it is possible to obtain highly stable solder paste improved in the solderability.

BEST MODES FOR CARRYING OUT THE INVENTION

The present inventors have conducted extensive studies on the amount of Bi to be added to Sn—Zn based solder that has attracted attention as promising Pb-free solder and, as a result, have found that thermal shock resistance can be remarkably improved by reducing the amount of Bi added to the solder to approximately 1% and that wettability can be remarkably improved by use of specific flux. Consequently, it is made possible to provide a solder material that attains high joining reliability.

The present inventors have also found that reducing the Zn content to approximately 7% enables oxidation of Sn—Zn binary solder alloy to be prevented, wettablity of the binary solder alloy to be improved and chip standing phenomenon to be suppressed and that wettability can be remarkably improved by use of specific flux in combination. Consequently it is made possible to provide a solder material that attains excellent property of mounting electronic parts onto a circuit board.

The inventors have also found that, by use of an active agent containing a halogen-containing and hydrogen-donating compound and a hydrocarbon compound having at least one primary, secondary or tertiary CH bond, soldering in air by use of Pb-free solder, which conventionally has been difficult to perform, can be effectively performed. The present invention has been accomplished on the basis of these findings.

The present invention provides solder metal consisting essentially of 8.8 to 5.0 mass % of Zn, 0.05 to 0 mass % of Bi and the balance of Sn and unavoidable impurities, solder metal consisting essentially of 9.0 to 5.0 mass % of Zn, 2.0 to 0.05 mass % of Bi and the balance of Sn and unavoidable impurities, solder metal consisting essentially of 8.5 to 6.5 mass % of Zn, 1.5 to 0.1 mass % of Bi and the balance of Sn and unavoidable impurities, and solder metal consisting essentially of 8.3 to 7.5 mass % of Zn, 1.2 to 0.5 mass % of Bi and the balance of Sn and unavoidable impurities. Use of the solder metal having the aforementioned ranges of the components can attain high wettability, high thermal shock resistance of joined portions and high solderability when soldering electronic parts onto a circuit board.

The term "unavoidable impurities" refers to elements that are inevitably intermingled during production of solder metal. The unavoidable impurities may alternatively be defined as elements that do not greatly affect the characteristics of solder metal even when these elements are intentionally added thereto. Generally, the amount of each of the unavoidable impurities mingled into solder metal is 1 mass % or less. Examples of the unavoidable impurities include non-metallic elements, semi-metallic elements, carbon, oxygen, nitrogen and transition metals. Of these, unavoidable elements, such as Pb, Ag, Sb, Cu, Fe, Al, As, Cd, etc., are readily migrated to solder metal. However, since intermingling of these elements does not adversely affect the characteristics of the solder metal of the present invention, they can be defined as unavoidable impurities.

The reason for controlling the composition of the solder metal so as to fall within the aforementioned ranges is as follows. In the case of Sn—Zn binary alloy, when Zn is contained in an amount higher than 8.8 mass %, the solder metal undergoes severe oxidation, and wettability is considerably deteriorated. In this case, when a parts-placed circuit board is reflowed, a chip standing phenomenon occurs. When the Zn content is less than 5.0 mass %, the melting temperature (liquidus) thereof is elevated to higher than 215° C., resulting in considerable shortening of the service life of mounted electronic parts attributable to their heat resistance. By controlling the Bi content to 0.05 mass % or less or to 0, reliability of joined portions and wettability can be enhanced.

In the case of Sn—Zn—Bi ternary alloy, when Zn is contained in an amount greater than 9.0 mass %, the solder metal undergoes severe oxidation, and wettability is deteriorated considerably. When the Zn content is less than 5.0 mass %, the melting temperature thereof is elevated to 215° C. or higher, resulting in considerable shortening of the service life of electronic parts attributable to their heat resistance. Thus, the Zn content is preferably controlled to 8.5 to 6.5 mass %, more preferably 8.3 to 7.5 mass %, from the viewpoint of prevention of oxidation and enhancement in wettability of the solder metal. When the Bi content is in excess of 2.0 mass %, thermal shock resistance of electronic-part-joined portions is deteriorated considerably, whereas when the Bi content is less than 0.05 mass %, wettability is deteriorated considerably. In order to attain required thermal shock resistance and high wettability, the Bi content is preferably controlled to 1.5 to 0.1 mass %, more preferably 1.2 to 0.5 mass %.

According to the present invention, a kneaded product of a flux and a solder powder formed from any one of the aforementioned solder metals is preferably employed as a solder paste. Preferably, in the solder paste, the solder powder content falls within a range of 86 to 92 mass %, and the flux content falls within a range of 8 to 14 mass %, based on the total amount of the solder paste.

The atomizing method can be raised as a typical method for producing solder powder from solder metal. More specifically, atomizing either by means of a disk-type atomizer or by means of spraying may be employed. The atomizing is preferably performed in an inert gas atmosphere, such as an atmosphere of nitrogen, argon or helium, in order to prevent oxidation of the solder powder. Needless to say, atomizing may be performed under vacuum. Generally, the thus-produced solder powder is classified by means of a classifier. The particle size range varies in accordance with the pitch of electronic parts to be mounted. When fine-pitch parts, such as 0.3-mm-pitch parts, 0603 chip parts and 0.5-mm CSPs, are to be mounted, solder powder classified to a particle size range of 38 to 22 µm, typically to 45 to 22 µm, is used. Although the classifier may be a vibration classifier or an airflow classifier, classification is preferably performed in an inert gas (e.g., nitrogen) flow so as to prevent oxidation. In addition, wet classification by use of a solvent may also be employed.

The particle size of solder powder is classified into some range groups as defined by the Japanese Industrial Standards (JIS); e.g., 63-22 µm, 45-22 µm and 38-22 µm. The particle size of solder powder is typically determined through a method defined in JIS employing standard sieves and a balance. However, when the method is employed, solder microparticles which often adhere onto the surfaces of solder powder particles by, for example, electrostaticity cannot be sufficiently removed, and the total amount of the solder microparticles determined becomes smaller than the actual total amount of the microparticles contained in the solder powder. When the solder powder that has undergone classification performed during particle size determination (e.g., in accordance with JIS) is observed under a microscope, a large number of solder microparticles are found to adhere onto a large solder particle. When the amount of such microparticles contained in solder powder increases, the solder powder is readily oxidized, thereby deteriorating storage stability and reflow characteristics of the solder paste.

The present inventors have found that solder powder of excellent characteristics can be obtained by controlling the particle size of the powder on the basis of a number-basis particle-size distribution profile of the solder particles, in addition to the method for determining the particle-size distribution defined in JIS.

The microparticle content in solder powder can also be determined by image analysis using a microscope or the electrozone method using a Coulter counter. The principle of a Coulter counter is described in "Powder Industry Handbook" edited by Powder Industry Association, 2nd ed., pp. 19-20). Specifically, a dispersion of powder is caused to pass through orifices provided in a separator, and a change in electrical resistance is detected by a pair of electrodes disposed on the respective sides of the separator. The particle-size distribution of the powder is determined on the basis of the change in electrical resistance, which depends of the particle size. According to this method, proportions in number of powder particles can be determined with high reproducibility. Employing the method for obtaining a particle-size distribution profile of solder powder enables quantitation of microparticles adhering onto the surfaces of solder particles, which microparticles tend to be released from the solder powder upon dispersing the powder in liquid and have not been detected on the basis of a mass-basis or volume-basis particle-size distribution profile obtained through a conventional method employing sieves.

The lower limit of particle sizes that can be detected by image analysis using a microscope or by the Coulter counter method is about 1 µm. Thus, through employment of any of the above methods, the amounts of microparticles having a particle size of 1 µm or less are difficult to determine. However, since solder powder produced through a typical atomizing method contains substantially no microparticles having a particle size of 1 µm or less, the aforementioned number-basis particle-size distribution profile of the solder microparticles can be performed for particles having a particle size of at least 1 µm.

According to the present invention, the amount of solder particles having a particle size of 20 µm or less contained in the solder powder is controlled to 30% or less, preferably 20% or less, as determined in a number-basis particle-size distribution profile. When the amount of solder particles having a particle size of 20 µm or less is in excess of the above upper limit, the surface area per unit mass increases, thereby readily causing oxidation of the powder. Thus, when solder paste is produced by use of such solder powder, melting performance during a reflow process of the solder powder contained in the solder paste is adversely affected. In addition, such powder readily reacts with flux, thereby shortening the shelf life of the solder paste and deteriorating tackiness of the solder paste.

Several methods for reducing the amount of microparticles contained in solder powder can be employed; e.g., presetting the particle size classification range of the solder powder upon classification to be greater than the target particle size range; repeating classification by use of sieves until the level of micropowders contained in the solder powder is lowered below the target level; retarding the feeding rate of the powder so as to facilitate removal of microparticles; and performing wet classification by use of a solvent other than water.

The solder powder employed in the present invention contains solder particles having a particle size not greater than the size of the sieve which determines the upper limit of particle size during classification of at least 90%, preferably at least 95%, as determined in a mass-basis particle-size distribution profile.

Atomic oxygen content of the solder powder employed in the present invention is preferably as low as possible. Specifically, the oxygen atom content is preferably controlled to 500 ppm or less, more preferably 300 ppm or less, so as to enhance storage stability and reflow characteristics of the solder paste. In order to effectively lower the oxygen atom content in the solder powder, an atomizing step for producing solder powder is performed in an oxidation-resistive atmosphere, and the thus produced solder powder is handled in an oxidation-resistive atmosphere. More specifically, the aforementioned steps are preferably preformed in a vacuum or in an atmosphere containing inert gas, such as nitrogen gas, argon gas or helium gas.

Generally, soldering flux, solder paste, solder thread or liquid flux for flow soldering contains an active agent, a resin component formed of synthetic resin or rosin, a solvent, a thixotropic agent and optional additives, such as a pH-regulator, an anticorrosion agent, an anti-oxidant and an organic acid component.

The soldering flux of the present invention is characterized by containing, as active agents, a hydrocarbon compound having at least one primary, secondary or tertiary CH bond, and a halogen-containing and hydrogen-donating compound.

The halogen-containing and hydrogen-donating compound is a halogen-containing compound that serves as a reducing agent in the soldering flux. Among such compounds, particularly preferred is a compound that thermally decomposes at the temperature of application of the soldering flux to thereby generate a halogen.

Examples of the above halogen-containing compound include an organic halogenated compound that thermally decomposes at the temperature of application of the soldering flux to thereby generate hydrogen halide.

Conventionally, a variety of ionic active agents have been employed. However, such ionic active agents, which also exert activity at room temperature, adversely affect storage stability of Pb-free solder that is particularly oxidative. Therefore, an organic bromine compound that exerts activity through decomposition upon a reflow process is preferably added to Pb-free solder. JP-B SHO 56-32079, JP-B HEI 4-59079, JP-A HEI 3-106594, JP-A HEI 8-155676 and other publications disclose addition of an organic halogenated compound to soldering flux.

Examples of organic halogenated compounds which are preferably used in the present invention include 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 1,4-dibromo-2,3-butanediol, 2,3-dibromo-2-butene-1,4-diol, 1-bromo-3-methyl-1-butene, 1,4-dibromobutene, 1-bromo-1-propene, 2,3-dibromopropene, ethyl bromoacetate, ethyl α-bromocaprylate, ethyl α-bromopropionate, ethyl β-bromopropionate, ethyl α-bromoacetate, 2,3-dibromosuccinic acid, 2-bromosuccinic acid, 2,2-dibromoadipic acid, 2,4-dibromoacetophenone, 1,1-dibromotetrachloroethane, 1,2-dibromo-1-phenylethane, 1,2-dibromostyrene, 4-stearoyloxybenzyl bromide, 4-stearyloxybenzyl bromide, 4-stearylbenzyl bromide, 4-bromomethylbenzyl stearate, 4-stearoylaminobenzyl bromide, 2,4-bisbromomethylbenzyl stearate, 4-palmitoyloxybenzyl bromide, 4-myristoyloxybenzyl bromide, 4-lauroyloxybenzyl bromide, 4-undecanoyloxybenzyl bromide, 9,10,12,13,15,16-hexabromostearic acid, methyl 9,10,12,13,15,16-hexabromostearate, ethyl 9,10,12,13,15,16-hexabromostearate, 9,10,12,13-tetrabromostearic acid, methyl 9,10,12,13-tetrabromostearate, ethyl 9,10,12,13-tetrabromostearate, 9,10,12,13,15,16-hexabromostearyl alcohol, 9,10,12,13-tetrabromostearyl alcohol, 1,2,5,6,9,10-hexabromocyclododecane, bis(2,3-dibromopropyl) succinate, bis(2,3-dibromopropyl) o-phthalate, bis(2,3-dibromopropyl) p-phthalate, bis(2,3-dibromopropyl)-o-phthalamide, bis(2,3-dibromopropyl)-p-phthalamide, tris(2,3-dibromopropyl) trimellitate, tris(2,3-dibromopropyl)-trimellitamide, tetra(2,3-dibromopropyl) pyromellitate, tetra (2,3-dibromopropyl)-pyromellitamide, bis(2,3-dibromopropyl)-glycerol, trimethylolpropanebis(2,3-dibromopropyl) ether, bis(2,3-dibromopropyl)-tartamide, N,N'-bis(2,3-dibromopropyl)-succinamide, N,N,N',N'-tetra (2,3-dibromopropyl)-succinamide, N,N'-bis(2,3-dibromopropyl)-urea, N,N,N',N'-tetra(2,3-dibromopropyl)-urea, 2,2-bis[4-(2,3-dibromopropyl)-3,5-dibromophenyl]propane, α,α,α-tribromomethylsulfone, α,β-dibromoethylbenzene and tris(2,3-dibromopropyl) isocyanurate. Of these, 9,10,12, 13,15,16-hexabromostearic acid, methyl 9,10,12,13,15,16-hexabromostearate, ethyl 9,10,12,13,15,16-hexabromostearate and tris(2,3-dibromopropyl) isocyanurate are particularly preferably used. Although the reason why these organic halogenated compounds are preferably used with soldering flux has not been elucidated, a conceivable reason is that the temperature at which these compounds thermally decompose to thereby generate hydrogen halide is approximately equal to the preheating temperature.

Alternatively, corresponding organic halogenated compounds containing chlorine or iodine instead of bromine may be used. These compounds may be used singly or in combination of two or more species.

The organic halogenated compound is added to soldering flux in an amount falling within a range of 0.02 to 20 mass %, preferably 0.1 to 10 mass %, in terms of chlorine-based on the total amount of the soldering flux. When the amount is less than 0.02 mass %, solderability during a reflow process is attained insufficiently, whereas when the amount is in excess of 20 mass %, cost disadvantageously increases and the relative amounts of other flux components are reduced, thereby failing to satisfactorily attain other functions required for flux.

The amount in terms of chlorine is calculated on the basis of the ratio of the molecular weight of the organic chlorine-containing compound to that of the organic bromine-containing compound.

An ionic bromine-containing active agent exerts its effect through addition thereof in a small amount and does not affect the stability of paste containing the agent. In order to reduce the amount of an expensive organic halogenated compound, the ionic bromine-containing active agent may be used in combination with the organic halogenated compound.

Examples of other ionic active agents that are preferably added include amine hydrohalides, such as isopropylamine hydrobromide, butylamine hydrochloride and cyclohexylamine hydrobromide, and 1,3-diphenylguanidine hydrobromide.

Hydrochlorides and hydroiodides may be used instead of hydrobrimides. These hydrohalides may be used singly or in combination of two or more species. The amount of hydrohalide falls within a range of 0.0005 to 2 mass %, preferably 0.01 to 1 mass %, based on the total amount of flux. When the amount is less than 0.0005 mass %, activity thereof is poor, whereas when the amount is in excess of 2 mass %, the hydrohalide reacts with an active agent contained in the flux, thereby deteriorating stability of solder paste.

According to the present invention, a hydrocarbon compound having at least one primary, secondary or tertiary CH bond is added. Preferably, the hydrocarbon compound is readily oxidized by oxygen at about 100 to about 150° C. Examples of such compounds include tetralin, tetraisobutylene, octahydroanthracene, 1-α-naphthyl-1-n-butylhexadecene, 9,10-dihydro-9,10-diisobutylanthracene, n-octadecylbenzene, β-n-octadecyltetralin, polyisobutylene, α-phenyl-2-tetralylbutane, 9,10-diisobutylperhydroanthracene and 5-isobutylacenaphthene. The hydrocarbon compound is added in an amount falling within a range of 0.01 to 20 mass %, preferably 0.5 to 5 mass %, based on the total amount of the flux.

Although the oxidation mechanism has not been elucidated in detail, the following mechanism is conceived. The hydrocarbon compound having at least one primary, secondary or tertiary CH bond is oxidized by oxygen at a typical preheating temperature of about 100 to about 150°

C., and the halogen-containing and hydrogen-donating compound catalyzes the above oxidation.

When conventional solder paste is preheated at about 150° C., solder powder is considerably oxidized. However, since the solder paste of the present invention contains a hydrocarbon compound having at least one primary, secondary or tertiary CH bond, the hydrocarbon compound reacts with oxygen at preheating temperature to thereby incorporate oxygen into the compound, and oxidation of the solder powder at preheating temperature is prevented. In addition, hydrogen halide reduces oxidized portions of the solder surface, thereby possibly enhancing solderability.

The soldering flux of the present invention may further contain a solvent, a resin component, a thixotropic agent and optional additives that include an anticorrosion agent, an anti-oxidant and a pH-regulator.

The soldering flux of the present invention may employ solvents used in conventional fluxes and solder pastes, specifically, alcohols, ethers, esters, middle or higher glycols (alcohols) and aromatic solvents. These solvents may be used singly or in combination of two or more species. Specific examples include benzyl alcohol, butanol, ethyl cellosolve, butyl cellosolve, butyl carbitol, propylene diglycol monobutyl ether, diethylene glycol monophenyl ether, diethylene glycol hexyl ether, propylene glycol monophenyl ether, diethylene glycol monohexyl ether, diethylene glycol mono-2-ethylhexyl ether, dioctyl phthalate, xylene, 2-methyl-1,3-hexanediol, 2-ethyl-1,3-hexanediol and mixtures thereof.

A known resin that has conventionally been blended into flux may be blended into the soldering flux of the present invention. Examples of such resins include natural rosin, disproportionated rosin, polymerized rosin, hydrogenated rosin, modified rosin, rosin derivatives, such as rosin esters, and synthetic resins, such as polyester, polyurethane and acrylic resin.

A thixotropic agent to be added for the improvement of printability may be an inorganic substance, such as fine silica particles or kaolin particles, or an organic substance, such as hydrogenated castor oil or an amide compound.

Examples of the pH-regulator that may be added to the soldering flux of the present invention include amine compounds, such as alkanolamines, aliphatic primary to tertiary amines, aliphatic unsaturated amines, alicyclic amines and aromatic amines. These amines may be used singly or in combination of two or more species.

The pH of the soldering flux of the present invention preferably falls within a range of 4 to 9, more preferably 6 to 8, from the viewpoint of suppressing reaction of solder powder with the flux. According to the present invention, the pH-regulator is preferably added in an amount falling within a range of 0.05 to 20 mass % based on the total amount of the soldering flux. When the amount is less than 0.05 mass %, effect of the pH-regulator is poor, whereas when the amount is in excess of 20 mass %, the solder paste tends to become hygroscopic, which is not preferred.

Specific examples of the above amine compounds include ethanolamine, butylamine, aminopropanol, polyoxyethylene oleylamine, polyoxyethylene laurylamine, polyoxyethylene stearylamine, diethylamine, triethylamine, methoxypropylamine, dimethylaminopropylamine, dibutylaminopropylamine, ethylhexylamine, ethoxypropylamine, ethylhexyloxypropylamine, bispropylamine, isopropylamine, diisopropylamine, piperidine and 2,6-dimethylpiperidine.

To the soldering flux of the present invention, any azole may be added as an anticorrosion agent. Examples of such azoles include benzotriazole, benzimidazole and tolyltriazole. Such an anticorrosion agent is added preferably in an amount falling within a range of 0.05 to 20 mass % based on the total amount of flux.

The soldering flux of the present invention preferably contains an anti-oxidant. Anti-oxidants that serve as typical reducing agents of synthetic resin or similar material and can be dissolved in a solvent are used as the above anti-oxidant. Examples include phenolic compounds, phosphate compounds, sulfur-containing compounds, tocopherol and its derivatives, and ascorbic acid and its derivatives. These reducing agents may be used singly or in combination. The reducing agent is added in an amount falling within a range of 0.0005 to 20 mass %, preferably 0.01 to 10 mass %, based on the total amount of the flux.

Although the mechanism of action of the added anti-oxidant has not been elucidated in detail, the anti-oxidant is conceived to interact with oxygen dissolved in solder paste or contained in air, thereby preventing oxidation of solder metal. Furthermore, it is also conceived that the anti-oxidant also serves as an acceptor for capturing halogen species released from a halogen-containing component, thereby effectively inhibiting reaction of the released halogen species with solder metal.

Examples of the organic acid component include conventionally known acids, such as succinic acid, phthalic acid, stearic acid and sebacic acid. Derivatives of such acids, which are compounds that generate an organic acid when the derivatives reach the reflow temperature, are preferably used. Organic acid esters that decompose to form the corresponding acids exhibit poor decomposability at the reflow temperature when used singly. Thus, a small amount of an ester decomposition catalyst is effectively added in order to promote decomposition. No particular limitation is imposed on the ester decomposition catalyst, so long as the catalyst promotes generation of acid through decomposition of a decomposable organic acid ester at the reflow temperature. Among such catalysts, organic bases and hydrohalide salts are particularly effective.

Examples of organic acid esters include various aliphatic carboxylic acid esters, aromatic carboxylic acid esters, aliphatic sulfonic acid esters and aromatic sulfonic acid esters. Specific examples include n-propyl p-toluenesulfonate, isopropyl p-toluenesulfonate, isobutyl p-toluenesulfonate, n-butyl p-toluenesulfonate, n-propyl benzenesulfonate, isopropyl benzenesulfonate, isobutyl benzenesulfonate, n-propyl salicylate, isopropyl salicylate, isobutyl salicylate, n-butyl salicylate, isopropyl 4-nitrobenzoate, t-butyl 4-nitrobenzoate, t-butyl methacrylate, t-butyl acrylate, t-butyl malonate and t-butyl bromoacetate. The amount of the organic acid ester to be added is in the range of 0.01 to 20 mass %, preferably 0.05 to 5 mass %, based on the total amount of flux.

In the present invention, solder powder made from the solder metal is preferably kneaded with flux to form solder paste. In this case, the ratios of the solder powder and flux are preferably in the ranges of 86 to 92 mass % and of 14 to 8 mass %, respectively, based on the total amount of the solder paste.

The solder paste of the present invention is advantageously used in producing a joined product having electronic parts joined to a substrate, such as a circuit board. In a method of using the flux and solder paste of the present invention and a method of producing joined products, the solder paste is applied to portions of a circuit board intended for soldering by a printing method or similar means, electronic parts are placed on the portions, and the circuit board is then heated to melt the solder particles. The melted solder particles are allowed to solidify to enable the electronic parts to be joined to the circuit board.

A typical method for joining a substrate and electronic parts (i.e., a mounting method) is a surface mounting technology (SMT). This mounting method involves applying solder paste to a desired portion on a substrate, such as a wiring board, through printing, subsequently placing electronic parts, such as chip parts and QFPs, on the applied solder paste, and soldering the entirety by means of a reflow heat source. Examples of such a reflow heat source include a hot air chamber, an infrared radiation chamber, a vapor phase condensation soldering apparatus and a light-beam soldering apparatus.

The reflow process of the present invention is performed preferably in two steps, i.e., the step of preheating and the step reflow. Regarding conditions, the preheating temperature is 130 to 180° C., preferably 130 to 150° C. The preheating time is 60 to 120 seconds, preferably 60 to 90 seconds. The reflow temperature is 210 to 230° C., preferably 210 to 220° C. The reflow time is 30 to 60 seconds, preferably 30 to 40 seconds.

When the solder paste of the present invention is used, the aforementioned reflow process can be carried out both in a nitrogen atmosphere and in air. When the nitrogen atmosphere is chosen, the oxygen concentration of the atmosphere is controlled to 5 vol % or less, preferably 0.5 vol % or less, to thereby enhance wettability of solder to a substrate, such as a wiring board, as compared with a reflow process in air. In addition, generation of solder balls is suppressed to thereby attain smooth treatment.

Subsequently, the reflowed substrate is cooled to complete surface mounting. In this mounting method, joining may be effected on both sides of a substrate, such as a printed wiring board (onto which electronic parts are to be mounted), for producing electronic-parts-mounted products. No particular limitation is imposed on the electronic parts to which the solder paste of the present invention can be applied. Examples of the electronic parts include LSIs, resistors, capacitors, transducers, inductors, filters, oscillators and vibrators.

Alternatively, mounting is carried out by use of the solder paste of the present invention through the SMT (surface mounting technology) on a circuit substrate which is prepared in the following manner: forming in advance adhesive coating film exclusively on a predetermined surface portion of a substrate (e.g., metallic wiring of a printed wiring board) by means of chemical reaction; depositing solder powder on the adhesive coating film; applying flux thereon and reflowing by heating to the melting temperature of the solder, to form solder bumps on the circuit substrate (JP-A HEI 7-7244). In this case, excellent solderability can be attained.

As compared with conventional solder metal and solder paste, the solder metal or solder paste of the present invention exhibits excellent characteristics, such as reflow characteristics, solderability, wettability to a metal to be joined and printability, and suppresses generation of solder balls during a reflow process. Particularly, the solder metal or solder paste of the present invention exhibits remarkably enhanced wettability to electronic parts and circuit substrates to be joined and remarkably enhances thermal shock resistance of joined products. Furthermore, the Pb-free solder alloy of the present invention, generating less environmental-pollutant waste, is suited for attaining fine-pitch mounting of electronic parts (e.g., producing fine-pitch electronic-parts-mounted circuit boards) and is adapted to a variety of electronic parts. Thus, the present invention can provide a wiring board of a long service life of the electronic parts mounted thereon.

EXAMPLES

The present invention will next be described in more detail by way of examples, which should not be construed as limiting the invention thereto.

<Test Methods>

(1) Number-Basis Distribution Profile of Solder Microparticles:

A Coulter counter (Multi-sizer model II, product of Coulter Electronics) was employed. A solder powder (1 g) was dispersed in a 1% NaCl electrolyte (100 mL). The thus yielded dispersion was placed in a detector equipped with a detection tube (orifice size: 400 μm) and analyzed to thereby obtain a particle size distribution profile. The proportion of the powder (particle size of 1 μm or more) in the particle size distribution profile was obtained.

(2) Oxygen Content:

The oxygen content was determined by use of an oxygen analyzer (product of RECO) through the IR absorption method.

(3) Water Content:

Solder paste was placed in a water vaporization apparatus (ADP-351, product of Kyoto Denshi Kogyo) and heated to 150° C. so as to vaporize. The formed gas was fed to a Karl Fischer water content meter (MKC-210, product of Kyoto Denshi Kogyo) by the mediation of nitrogen serving as a carrier gas, whereafter the water content of the gas was determined.

(4) pH:

Flux (4 g) was dissolved in a mixture of toluene (50 mL), isopropyl alcohol (49.5 mL) and water (0.5 mL). The thus yielded solution was subjected to pH measurement by means of a pH meter. When the sample is solder paste, the solder paste was weighed in an amount corresponding to 4 g of flux, and pH was measured in a similar manner.

(5) Solder Ball Test 1:

A solder ball test was performed in accordance with JIS Z-3284. Each solder paste was applied to an alumina test plate through printing by use of a metallic mask (thickness: 0.2 mm) having four holes (diameter: 6.5 mm) to thereby prepare disk-form test samples. Each of these samples was dried at 150° C. for one minute and then heated to 235° C. to thereby melt the solder. Within five seconds after melting of the solder, the sample was removed in a horizontal orientation and allowed to stand in a horizontal orientation until the solder on the sample was solidified. Subsequently, the general appearance of the thus-solidified solder was observed under a magnifying lens (×20), and generation of solder microparticles around solder particles was observed under a magnifying lens (×50). Each sample was evaluated in terms of solder ball generation on the basis of the standards described in JIS Z-3284. Samples rated 3 or less were evaluated to be test-not-passed samples (denoted by x in Table 1), and those rated higher than 3 were denoted by ⊚, ○ and Δ in the order of excellence of state.

(6) Wettability:

Wettability was determined in accordance with JIS Z-3284. Each solder paste was applied to a copper test plate through printing by use of a metallic mask (thickness: 0.2 mm) having four holes (diameter: 6.5 mm) to thereby prepare disk-form test samples. Each of these samples was dried at 150° C. for one minute and then heated to 235° C. to thereby melt the solder. Within five seconds after melting of solder, the sample was removed in a horizontal orientation and allowed to stand in a horizontal orientation until the solder on the sample was solidified. Subsequently, each sample was evaluated in terms of wettability on the basis of the standards described in JIS Z-3284. Samples rated 3 or less were evaluated to be test-not-passed samples (denoted by x in Table 1), and those rated higher than 3 were denoted by ⊚, ◯ and Δ in the order of excellence of wettability.

(7) Shock Resistance Test:

Each test substrate (thickness: 1.6 mm, 100 mm×100 mm) was subjected to a shock resistance test. L-QFP (100 pins mounted on copper lead via Sn-10Pb plating) was employed as an electronic part. Prior to the test, a copper pattern formed on the test substrate was etched in a depth of 1 to 2 μm with a soft-etching liquid (MECBRITE CB-801, product of MEC Co., Ltd.) and then treated with a heat-resistant pre-flux (MEC Pre-flux R-4030, product of MEC Co., Ltd.). Each solder paste was applied to the test substrate through printing by use of a 150-μ metallic mask, and the L-QFP (plated with Sn—Pb) was placed on the solder. The resultant test substrate was subjected to a reflow step (pre-heating at 160° C. for 90 seconds, peak temperature of 220° C. and maintenance at 200° C. or higher for 30 seconds). Each test substrate was subjected to the reflow step twice, in view that in actual situations, double-side reflowing is performed. On one side (side on which no parts were mounted) of the thus-prepared test piece for thermal shock test, wire (φ 1.5 mm) was disposed in the center, with both ends being secured by means of heat-resistant Kapton tape such that strain load is forcedly applied. The thus-modified test substrate was placed in a thermal shock tester, and joining strength was determined under cooling-heating (−40° C. for 30 minutes, +125° C. for 30 minutes) cycles (determined at an initial stage and after 100 cycles, 300 cycles, and 500 cycles). The joining strength was determined in accordance with the 450 peel strength method (20 pins/unit) at a peeling speed of 20 mm/min. Determination of the strength and observation of the peeled surface were performed by means of a stereo-microscope (magnification: ×40). In the observation results, the case in which at least one pin was peeled was evaluated as test-not-passed (n Table 1, x denotes test-not-passed, and ◯ denotes test-passed).

(8) Chip Standing Test:

Each test substrate (thickness: 1.6 mm, 100 mm×100 mm) was subjected to a chip standing test. Parts "1608" (1.6 mm×0.8 mm, plated with Sn-10Pb) were employed as electronic parts (chips). Prior to the test, a copper pattern formed on the test substrate was etched in a depth of 1 to 2 μm with a soft-etching liquid (MECBRITE CB-801, product of MEC Co., Ltd.) and then treated with a heat-resistant pre-flux (MEC Pre-flux R-4030, product of MEC Co., Ltd.). Each solder paste was applied on the test substrate through printing by use of a 150-μ metallic mask, and ten pieces of the chips (plated with Sn-10Pb) were placed on the printed solder. The resultant test substrate was subjected to a reflow step (pre-heating at 160° C. for 90 seconds, peak temperature of 220° C., and maintenance at 200° C. or higher for 30 seconds). The case in which no chip standing was observed was assigned rating ◯, the case in which one standing pin was observed was assigned rating Δ, and the vase in which two or more standing pins were observed was assigned rating X.

(9) Solder Ball Test 2:

Each solder paste was applied to an alumina substrate through printing by use of a printing mask (thickness: 0.2 mm) having five holes (diameter: 6.5 mm), to thereby prepare nine test samples. Eight of the nine test samples were placed in a thermostatic, hygrostatic chamber (30° C., 90%), and the eight samples were removed one by one at intervals of three hours.

Each of these samples was placed on a hot plate whose temperature had been preset at 235° C. Five seconds after melting of solder, the sample was removed and allowed to stand until the solder was cooled.

The general appearance of the thus-solidified solder was observed under a magnifying lens (×10), to thereby evaluate the solder on the basis of the aggregation state of solder particles as defined in Table 1 and FIG. 1 of JIS Z-3284 (Appendix 11).

Specifically, evaluation was performed on the basis of the following rating groups in terms of aggregation state of the melted solder powder: the case in which the melted solder forms one large ball, and no solder balls are observed around the large ball (rating 1); the case in which the melted solder forms one large ball, and three or more solder balls (diameter: ≦75 μm) are observed around the large ball (rating 2); the case in which the melted solder forms one large ball, three or more solder balls (diameter: ≦75 μm) are observed around the large ball, with the solder balls forming a broken circle segment (rating 3); the case in which the melted solder forms one large ball, a large number of small solder balls (diameter: ≦75 μm) are observed around the large ball, with the solder balls forming a broken circle (rating 4); and cases other than the above four cases (rating 5).

(10) Observation of Voids:

On each copper plate (60 mm×60 mm), 6 patterns (diameter 6 mm) were formed through printing by use of a metal mask (thickness 150 μ). Each of the samples was subjected to a reflow process under atmospheric conditions, and the resultant sample was cut by means of a cutter. The cross-section of solder portions was observed under a microscope, to thereby investigate void generation. The number of voids of 10 μm in size or larger was counted in 6 patterns. When the average number per pattern was 2 or more, the sample was indicated as "test not passed."

Examples 1 to 11 and Comparative Examples
1 to 8

The present invention will next be described in detail by way of Examples and Comparative Examples. The modes for carrying out the invention are not limited to Examples 1 to 11 and exemplified methods for producing an electronic-parts-joined product.

<Production of Flux and Solder Paste>

Each of flux samples was prepared by mixing the following components: polymerized rosin (17.5 mass %) and disproportionated rosin (27.5 mass %) serving as resin components; hydrogenated castor oil (6 mass %) serving as a thixotropic agent; n-propyl p-toluenesulfonate (0.5 mass %) serving as an organic acid ester; cyclohexylamine hydrobromide (0.08 mass %) serving as an ester decomposition catalyst; hexabromostearic acid (3.5 mass % or 0) serving as an organic hydrogenated compound; a mixture (1:1 by mass) of tocopherol and L-ascorbyl-2,6-dipalmitate (1.0 mass %) serving as a reducing agent; triethylamine (2 mass %) serving as a pH-adjusting agent; tolyltriazole (1 mass %) serving as an anti-corrosive agent; and propylene glycol monophenyl ether (balance) serving as a solvent, to thereby attain the total amount of 100 mass %.

To each flux (11 mass %) was added each solder powder having a metal composition shown in Table 1 (particle size range: 20 to 45 µm, proportion in number of ≦20-µm particles in a particle size distribution profile: 25% by number) (89 mass %), and the mixture was kneaded by means of a planetary mill, to thereby produce a solder paste (3 kg). Compositions of the solder pastes, compositions of the solder powders employed, and pH of fluxes are shown in Table 1. The solder powders employed were found to have an oxygen content of 300 ppm, and the solder pastes employed have a water content of 0.3 mass %.

<Production of Electronic-Parts-Joined Products>

Mounting of electronic parts by use of the solder paste of the present invention was performed through SMT. The solder paste having a composition of Example 4 was applied to one sheet of a circuit board through printing, and an LSI, a chip resistor, and a chip capacitor were placed on the solder paste. Then, the resultant assembly was heated by a reflow heat source, to thereby effect soldering. The reflow heat source was supplied from a hot air chamber.

The reflow process was performed under the following conditions: pre-heating temperature (130° C.), pre-heating time (80 seconds), reflow peak temperature (220° C.), and reflow time at 200° C. or higher (50 seconds).

The characteristics of the thus-produced printed wiring boards and solder pastes used for producing the wiring boards were evaluated through the aforementioned measurement methods. The results are shown in Table 1. As shown in solder ball test results, the solder pastes of Comparative Examples 1, 2, 3, and 8 generated a large amount of undissolved solder powder.

Examples 12 to 17 and Comparative Example 9

<Production of Flux and Solder Paste>

The following raw materials were used: hydrogenated castor oil (thixotropic agent); disproportionated rosin or polymerized rosin (resin component); cyclohexylamine hydrobromide or 1,3-diphenylguanidine hydrobromide (ionic active agent); benzotriazole (anticorrosion agent); propylene diglycol monobutyl ether (solvent); 9,10,12,13,15,16-hexabromostearic acid, methyl 9,10,12,13,15,16-hexabromostearate, or tris(2,3-dibromopropyl) isocyanurate (organic halogenated compound); tripropylamine (amine); and n-propyl p-toluenesulfonate (organic acid component).

A powder (90 mass %) of solder, 91Sn/8Zn/1Bi, was added to each soldering flux (10 mass %), and the mixture was kneaded by means of a planetary mill, to thereby produce a solder paste.

Table 2 shows compositions of solder pastes, and Table 3 shows results of evaluation. Furthermore, solder ball test 2 is used, and the results of the samples subjected to thermostatic and hygrostatic treatment for 24 hours are shown in Table 3.

The solder paste samples of Examples 12 to 17 containing, as active agents, a hydrocarbon compound having at least one primary, secondary, or tertiary CH bond, and a halogen-containing hydrogen-donating compound exhibit remarkably excellent solderability, as compared with the solder paste sample of Comparative Example 9, in the solder ball test and void observation.

TABLE 1

| | Solder composition | | | Org. halogenated | | Solder ball | | Shock resistance test | | | | Chip |
| | Zn | Bi | Sn | compound | pH | test 1 | Wettability | Initial | 100 cycles | 300 cycles | 500 cycles | standing |
|---|---|---|---|---|---|---|---|---|---|---|---|---|
| Ex. 1 | 8.8 | — | bal | Hexabromostearic acid | 7.5 | ⊚ | ○ | ○ | ○ | ○ | ○ | Δ |
| 2 | 7.0 | — | bal | Hexabromostearic acid | 6.9 | ⊚ | ⊚ | ○ | ○ | ○ | ○ | ○ |
| 3 | 5.0 | — | bal | Hexabromostearic acid | 7.2 | Δ | ○ | ○ | ○ | ○ | ○ | ○ |
| 4 | 7.0 | 0.05 | bal | Hexabromostearic acid | 7.9 | ⊚ | ⊚ | ○ | ○ | ○ | ○ | ○ |
| 5 | 8.0 | 2.0 | bal | Hexabromostearic acid | 7.6 | ⊚ | ⊚ | ○ | ○ | ○ | ○ | ○ |
| 6 | 8.0 | 1.0 | bal | Hexabromostearic acid | 7.8 | ⊚ | ⊚ | ○ | ○ | ○ | ○ | ○ |
| 7 | 9.0 | 2.0 | bal | Hexabromostearic acid | 7 | Δ | ○ | ○ | ○ | ○ | ○ | ○ |
| 8 | 7.0 | 2.0 | bal | Hexabromostearic acid | 7.1 | ○ | ○ | ○ | ○ | ○ | ○ | ○ |
| 9 | 6.0 | 2.0 | bal | Hexabromostearic acid | 7.3 | Δ | ○ | ○ | ○ | ○ | ○ | ○ |
| 10 | 5.0 | 2.0 | bal | Hexabromostearic acid | 7.4 | Δ | Δ | ○ | ○ | ○ | ○ | ○ |
| 11 | 8.0 | 1.0 | bal | Not added | 7.9 | ○ | ○ | ○ | ○ | ○ | ○ | ○ |
| Comp. Ex. 1 | 9.0 | — | bal | Hexabromostearic acid | 6.9 | Unsol. | X | ○ | ○ | ○ | ○ | X |
| 2 | 4.0 | — | bal | Hexabromostearic acid | 7.1 | Unsol. | X | X | X | X | X | X |
| 3 | 4.5 | — | bal | Hexabromostearic acid | 7.3 | Unsol. | X | ○ | X | X | X | Δ |
| 4 | 8.0 | 6.0 | bal | Hexabromostearic acid | 7.7 | ⊚ | ⊚ | X | X | X | X | ○ |
| 5 | 8.0 | 3.0 | bal | Hexabromostearic acid | 6.8 | ⊚ | ⊚ | ○ | ○ | X | X | ○ |
| 6 | 9.0 | 2.5 | bal | Hexabromostearic acid | 7 | ○ | ○ | ○ | ○ | X | X | ○ |
| 7 | 9.5 | 2.0 | bal | Hexabromostearic acid | 7.3 | Δ | Δ | ○ | ○ | ○ | X | ○ |
| 8 | 4.5 | 0.05 | bal | Hexabromostearic acid | 7.2 | Unsol. | X | X | X | X | X | ○ |

TABLE 2

| Amount (mass %) | Ex. 12 | Ex. 13 | Ex. 14 | Ex. 15 |
|---|---|---|---|---|
| Disproportionated rosin | 26.5 | 26.5 | 26.5 | 26.5 |
| Polymerized rosin | 17 | 17 | 17 | 17 |

TABLE 2-continued

| | | | | |
|---|---|---|---|---|
| Tripropylamine | 2.5 | 2.5 | 2.5 | 2.5 |
| Hydrogenated castor oil | 6 | 6 | 6 | 6 |
| n-Propyl p-toluenesulfonate | 0.05 | 0.05 | 0.05 | 0.05 |
| Benzotriazole | 1 | 1 | 1 | 1 |
| Solvent | PGBE | PGBE | PGBE | PGBE |
| Amount of Solvent | 39.95 | 39.85 | 39.95 | 37.95 |
| Ionic active agent | — | CHA-HBr | 1,3-DPG-HBr | CHA-HBr |
| Amount of ionic active agent | — | 0.1 | 0.1 | 0.1 |
| Org. halogen compound | 9,10,12,13,15,16-HBSA | DBPI | 9,10,12,13,15,16-HBSA | 9,10,12,13,15,16-HBSM |
| Amount of org. halogen compound | 6 | 6 | 6 | 6 |
| Hydrocarbon compound | Tetralin | Tetralin | Tetralin | Tetralin |
| Amount of hydrocarbon compound | 1 | 1 | 1 | 3 |
| Solder composition | 91Sn/8Zn/1Bi | 91Sn/8Zn/1Bi | 91Sn/8Zn/1Bi | 91Sn/8Zn/1Bi |

| Amount (mass %) | Ex. 16 | Ex. 17 | Comp. Ex. 9 |
|---|---|---|---|
| Disproportionated rosin | 26.5 | 26.5 | 26.5 |
| Polymerized rosin | 17 | 17 | 17 |
| Tripropylamine | 2.5 | 2.5 | 2.5 |
| Hydrogenated castor oil | 6 | 6 | 6 |
| n-Propyl p-toluenesulfonate | 0.05 | 0.05 | 0.05 |
| Benzotriazole | 1 | 1 | 1 |
| Solvent | PGBE | PGBE | PGBE |
| Amount of Solvent | 39.95 | 39.95 | 40.95 |
| Ionic active agent | CHA-HBr | CHA-HBr | CHA-HBr |
| Amount of ionic active agent | 0.1 | 0.1 | 0.1 |
| Org. halogen compound | 9,10,12,13,15,16-HBSA | 9,10,12,13,15,16-HBSA | 9,10,12,13,15,16-HBSA |
| Amount of org. halogen compound | 6 | 6 | 6 |
| Hydrocarbon compound | Tetraisobutylene | Octahydroanthracene | — |
| Amount of hydrocarbon compound | 1 | 1 | — |
| Solder composition | 91Sn/8Zn/1Bi | 91Sn/8Zn/1Bi | 91Sn/8Zn/1Bi |

PGBE: Prolylene diglycol monobutyl ether,
CHA-HBr: Cyclohexylamine hydrobromide,
DPG-HBr: 1,3-Diphenylguanidine hydrobromide,
HBSA: Hexabromostearic acid,
DBPI: Tris(2,3-dibromopropyl)isocyanurate,
HBSM: Methyl hexabromostearate

TABLE 3

| | Ex. 12 | Ex. 13 | Ex. 14 | Ex. 15 | Ex. 16 | Ex. 17 | Comp. Ex. 9 |
|---|---|---|---|---|---|---|---|
| Solder ball test 2 | 1 | 1 | 1 | 1 | 1 | 1 | 3 |
| Void observation | Passed | Passed | Passed | Passed | Passed | Passed | Not passed |

INDUSTRIAL APPLICABILITY

As described hereinabove, by use of the solder paste containing a solder metal and a flux falling within the scope of the present invention, high wettability to electronic parts, high thermal shock resistance, and reduction of occurrence of chip standing can be attained. In addition, reaction between solder powder and flux is remarkably suppressed, thereby attaining remarkably excellent solderability.

As described hereinabove, solderability can be enhanced by employing, as an active agent for lead-free solder, the soldering flux of the present invention containing a halogen-containing hydrogen-donating compound, and a hydrocarbon compound having at least one primary, secondary, or tertiary CH bond. Particularly, solder balls and voids in bumps that are generated after reflowing can be reduced.

The solder paste of the present invention can provide circuit boards; a method for soldering a circuit board; soldered circuit boards; a method for joining electronic parts; and joined products, suited for producing fine-pitch electronic-parts-mounted circuit boards and a variety of electronic parts.

The invention claimed is:

1. Solder metal consisting essentially of 8.8 to 5.0 mass % of Zn, 0.05 to 0 mass % of Bi and the balance of Sn and unavoidable impurities, wherein the solder metal is in the form of solder powder containing solder particles having a particle size of 20 μm or less in an amount controlled to 30% or less in a number-basis particle-size distribution profile.

2. Solder metal consisting essentially of 8.5 to 6.5 mass % of Zn, 1.5 to 0.1 mass % of Bi and the balance of Sn and unavoidable impurities, wherein the solder metal is in the form of solder powder containing solder particles having a particle size of 20 μm or less in an amount controlled to 30% or less in a number-basis particle-size distribution profile.

3. Solder metal consisting essentially of 8.3 to 7.5 mass % of Zn, 1.2 to 0.5 mass % of Bi and the balance of Sn and unavoidable impurities, wherein the solder metal is in the form of solder powder containing solder particles having a particle size of 20 μm or less in an amount controlled to 30% or less in a number-basis particle-size distribution profile.

4. Soldering flux comprising a hydrocarbon compound having at least one primary, secondary or tertiary CH bond and a halogen-containing and hydrogen-donating compound which is an organic halogenated compound, wherein the halogen-containing and hydrogen-donating compound is contained in an amount falling within a range of 0.02 to 20 mass % in terms of chlorine based on a total amount of the soldering flux.

5. The soldering flux according to claim 4, wherein the hydrocarbon compound having at least one primary, secondary or tertiary CH bond is one species selected from the group consisting of tetralin, tetraisobutylene, octahydroanthracene, 1-α-naphthyl-1-n-butyl-hexadecene, 9,10-dihydro-9,10-diisobutylanthracene, n-octadecylbenzene, β-n-octadecyltetralin and polyisobutylene.

6. The soldering flux according to claim 4, wherein the hydrocarbon compound having at least one primary, secondary or tertiary CH bond is contained in an amount falling within a range of 0.01 to 20 mass%, based on a total amount of the soldering flux.

7. Solder paste comprising a solder metal consisting essentially of 8.8 to 5.0 mass % of Zn, 0.05 to 0 mass % of Bi and the balance of Sn and unavoidable impurities and the soldering flux according to claim 4.

8. The solder paste according to claim 7, wherein the solder metal is contained in an amount falling within a range of 86 to 92 mass % and the soldering flux is contained in an amount falling within a range of 14 to 8 mass%, respectively, based on a total amount of the solder paste.

9. A method for producing a printed circuit board, comprising the steps of applying the solder paste according to claim 7 or 8 onto a circuit board, placing electronic parts on portions to which the solder paste has been applied and heating the circuit board so as to mount the electronic parts on the circuit board.

10. Liquid flux for use in flow soldering, comprising the soldering flux according to claim 4 that is diluted with a solvent.

11. Rosin-containing solder thread comprising a solder metal consisting essentially of 8.8 to 5.0 mass % of Zn, 0.05 to 0 mass % of Bi and the balance of Sn and unavoidable impurities and the soldering flux according to claim 4.

* * * * *